US008367930B2

(12) United States Patent
Liang

(10) Patent No.: US 8,367,930 B2
(45) Date of Patent: Feb. 5, 2013

(54) GROUNDING MECHANISM FOR ELECTRONIC DEVICE

(75) Inventor: Shi-Xu Liang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 258 days.

(21) Appl. No.: 12/845,917

(22) Filed: Jul. 29, 2010

(65) Prior Publication Data

US 2011/0232935 A1 Sep. 29, 2011

(30) Foreign Application Priority Data

Mar. 26, 2010 (CN) .......................... 2010 1 0133608

(51) Int. Cl.
*H05K 4/02* (2006.01)

(52) U.S. Cl. .............. 174/51; 174/50; 439/60; 439/107; 439/539; 361/117; 361/118

(58) Field of Classification Search .................... 439/60, 439/107, 539; 174/51, 50; 361/117, 118
See application file for complete search history.

(56) References Cited

U.S. PATENT DOCUMENTS

| | | | | | |
|---|---|---|---|---|---|
| 4,944,700 | A | * | 7/1990 | Simon | 439/801 |
| 5,081,696 | A | * | 1/1992 | Beck | 392/449 |
| 6,293,812 | B1 | * | 9/2001 | Ewer et al. | 439/107 |
| 6,962,507 | B2 | * | 11/2005 | Suess | 439/532 |
| 7,220,152 | B2 | * | 5/2007 | Jeong | 439/862 |
| 7,744,384 | B2 | * | 6/2010 | Wu | 439/95 |
| 7,801,577 | B2 | * | 9/2010 | Lee | 455/575.1 |
| 2008/0241649 | A1 | * | 10/2008 | Kohri et al. | 429/96 |

* cited by examiner

*Primary Examiner* — Timothy Thompson
*Assistant Examiner* — Pete Lee
(74) *Attorney, Agent, or Firm* — Altis Law Group, Inc.

(57) ABSTRACT

A grounding mechanism is used for an electronic device. The electronic device includes a housing and a battery cover. The grounding mechanism typically includes an elastic member including a main portion, a first bent portion, a second bent portion and a clamping portion. The main portion is attached to the housing. The first bent portion and the second bent portion respectively extend from two opposite ends of the main portion. The clamping portion extends from one side of the main portion, and includes two arms for clamping one part of the battery cover.

5 Claims, 5 Drawing Sheets

GROUNDING MECHANISM FOR ELECTRONIC DEVICE

BACKGROUND

1. Technical Field

The present disclosure relates to grounding mechanisms and, particularly, to a grounding mechanism used in an electronic device.

2. Description of Related Art

Electronic devices usually include a plurality of electrical components provided therein so as to realize different functions. In order to prevent electrostatic charges from damaging the electrical components, a grounding mechanism is usually provided for removal of electrostatic charges from the electrical components.

However, a typical grounding structure of the electronic device complicates the assembly process. In addition, by increasing the volume of the electronic device, conventional grounding structures can compromise requirements for the electronic device to be compact.

Therefore, there is room for improvement within the art.

BRIEF DESCRIPTION OF THE DRAWINGS

Many aspects of the present grounding mechanism can be better understood with reference to the following drawings. The components in the drawings are not necessarily drawn to scale, the emphasis instead being placed upon clearly illustrating the principles of the present grounding mechanism. Moreover, in the drawings, all the views are schematic, and like reference numerals designate corresponding parts throughout the several views.

DETAILED DESCRIPTION

The present grounding mechanism may be applied in many different electronic devices such as mobile phones, game devices, PDAs (personal digital assistants) and others. In an illustrated exemplary embodiment, the grounding mechanism is used in a mobile phone.

Figure 1:
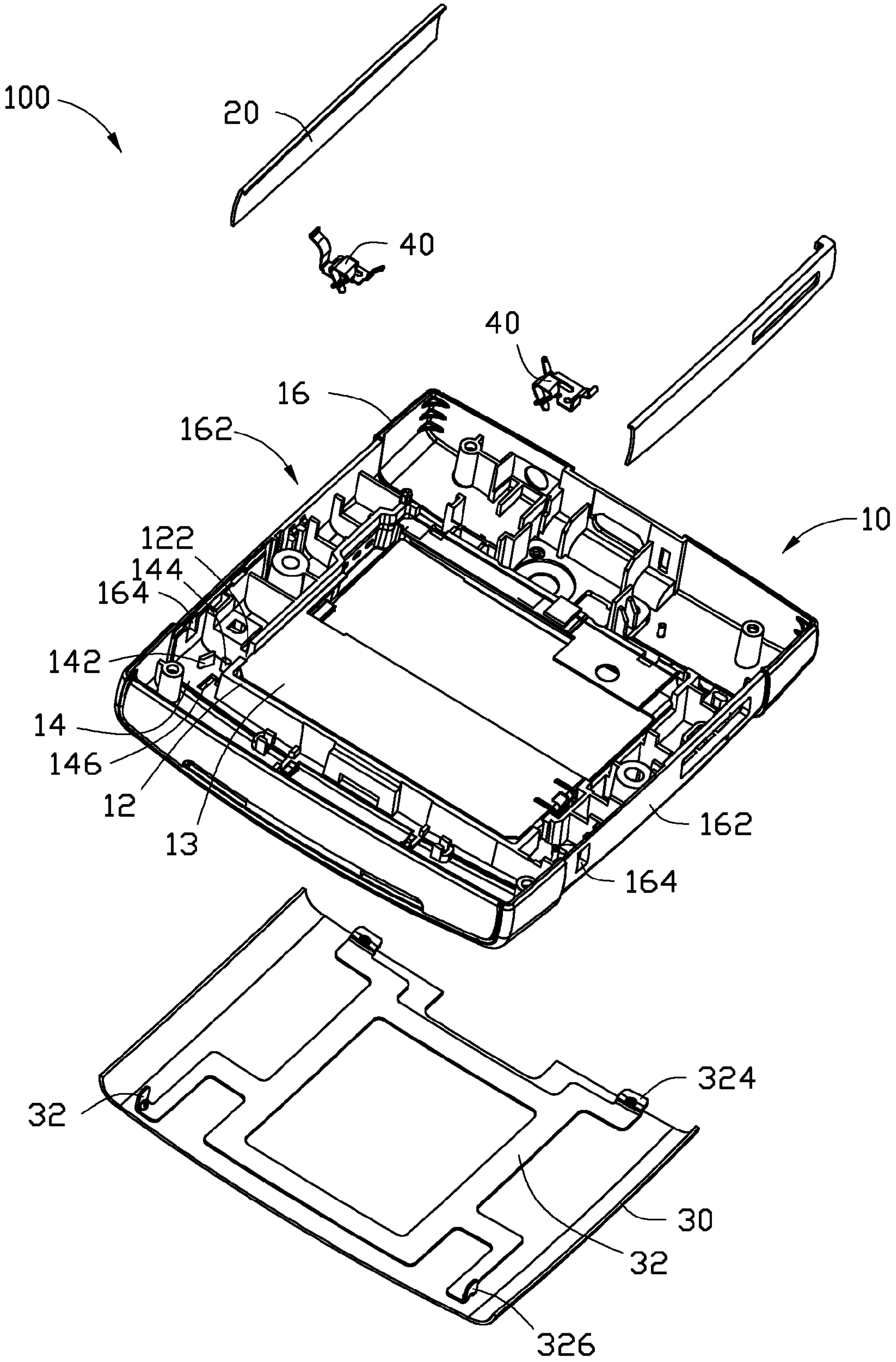
FIG. 1 is an exploded, isometric view of an electronic device using a grounding mechanism in accordance with an exemplary embodiment.

Referring to FIG. 1, the mobile phone 100 includes a housing 10, two side plates 20, a battery cover 30, and two elastic members 40. The elastic members 40 are electrically connected to the battery cover 30 and the side plates 20 for conducting electrostatic charges to a grounding pin of a circuit board (not shown).

The housing 10 is one portion of the mobile phone 100, and includes a base plate 14 and a plurality of sidewalls 16 surrounding the base plate 14. A frame 12 is formed on the base plate 14, and is spaced apart from the sidewalls 16. One side of the frame 12 adjacent to one sidewall 16 defines an opening 122. A conductive plate 13 is attached to the frame 12, and is exposed from the opening 122. The conductive plate 13 is electrically connected to a grounding pin of a circuit board. A first protrusion 142 and a second protrusion 144 protrude from the base plate 14 between one sidewall 16 and the frame 12. A notch 146 is defined in the base plate 14 adjacent to the first protrusion 142. Opposite sidewalls 16 respectively define a groove 162 and a cutout 164.

The two side plates 20 are made of metal configured for being received in the grooves 162, and may be fixed in the grooves 162 by means of, e.g., fusion.

The battery cover 30 is made of metal, and is attached to the housing 10. A metal sheet 32 is fixed to an inside of the battery cover 30. Two tabs 324 extend from one end of the metal sheet 32. Two catches 326 extend from the other end of the metal sheet 32.

Figure 2:
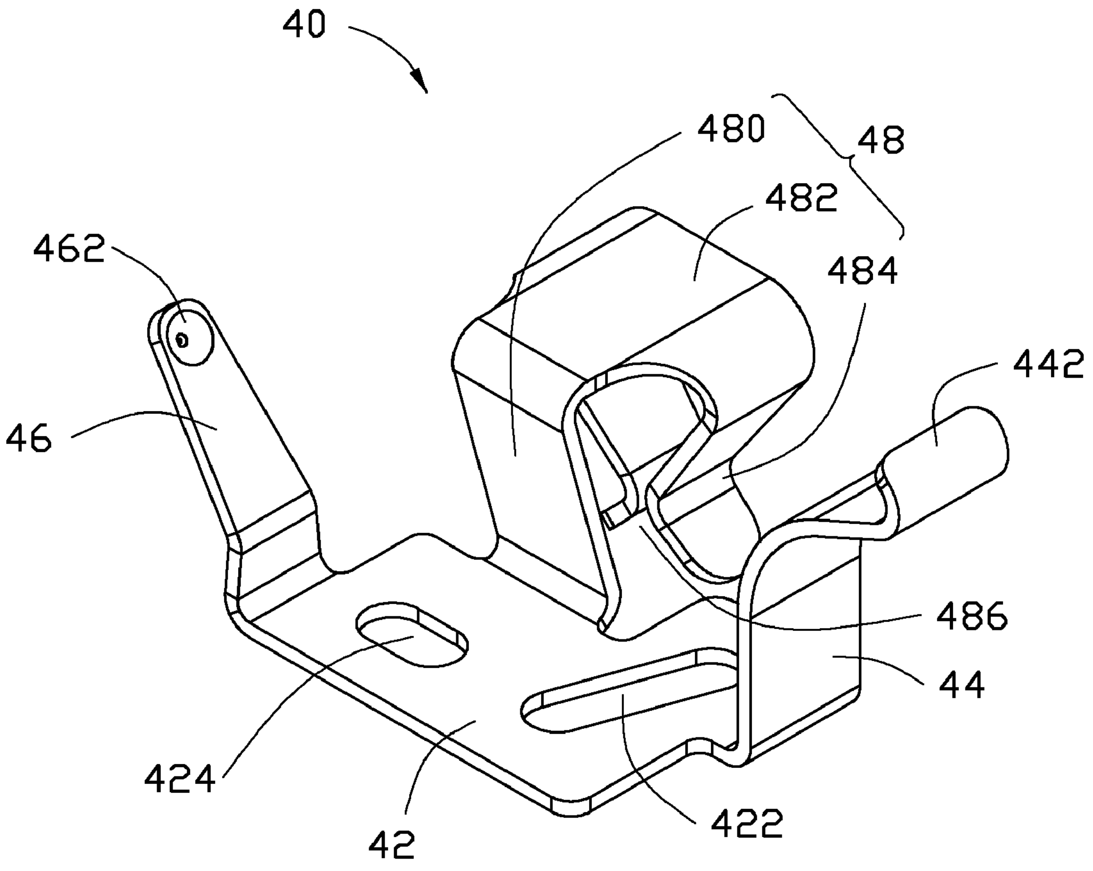
FIG. 2 is an enlarged, isometric view of an elastic member of the electronic device of FIG. 1.

Referring also to FIG. 2, each elastic member 40 is metal, preferably formed from sheet material. The elastic member 40 includes a main portion 42, a first bent portion 44, a second bent portion 46 and a clamping portion 48. The main portion 42 defines a first hole 422 and a second hole 424 configured for receiving the first and second protrusions 142, 144. The first bent portion 44 and the second bent portion 46 respectively extend from two opposite ends of the main portion 42. An arcuate finger end 442 is formed on a distal end of the first bent portion 44. When each elastic member 40 is fixed to the base wall 14, the arcuate finger end 442 extends through the cutout 164 to electrically connect to a corresponding side plate 20. A protrusion 462 extends from a distal end of the second bent portion 46. The second bent portion 46 may extend through the opening 122, whereupon the protrusion 462 elastically abuts against the conductive plate 13. A clamping portion 48 extends from one side of the main portion 42. The clamping portion 48 includes an angled section 480, a connecting section 482 and two arms 484. The angled section 480 is oriented at an approximately acute angle relative to the main portion 42. The connecting section 482 is substantially perpendicular to the angled section 480. The arms 484 extend from opposite sides of the connecting section 482. Each arm 484 includes an upper sloping portion extending obliquely down from the connecting section 482 in a direction generally toward the other arm 484, and a lower sloping portion extending obliquely down from the upper sloping portion in a direction generally away from the other arm 484 (as seen in FIGS. 1 and 2). Each arm 484 thus defines an elbow where the upper and lower sloping portions meet. A clearance 486 is defined between the two elbows of the arms 484. The corresponding catch 326 may be received in the clearance 486, and is then clamped by the two arms 484.

Figure 3:
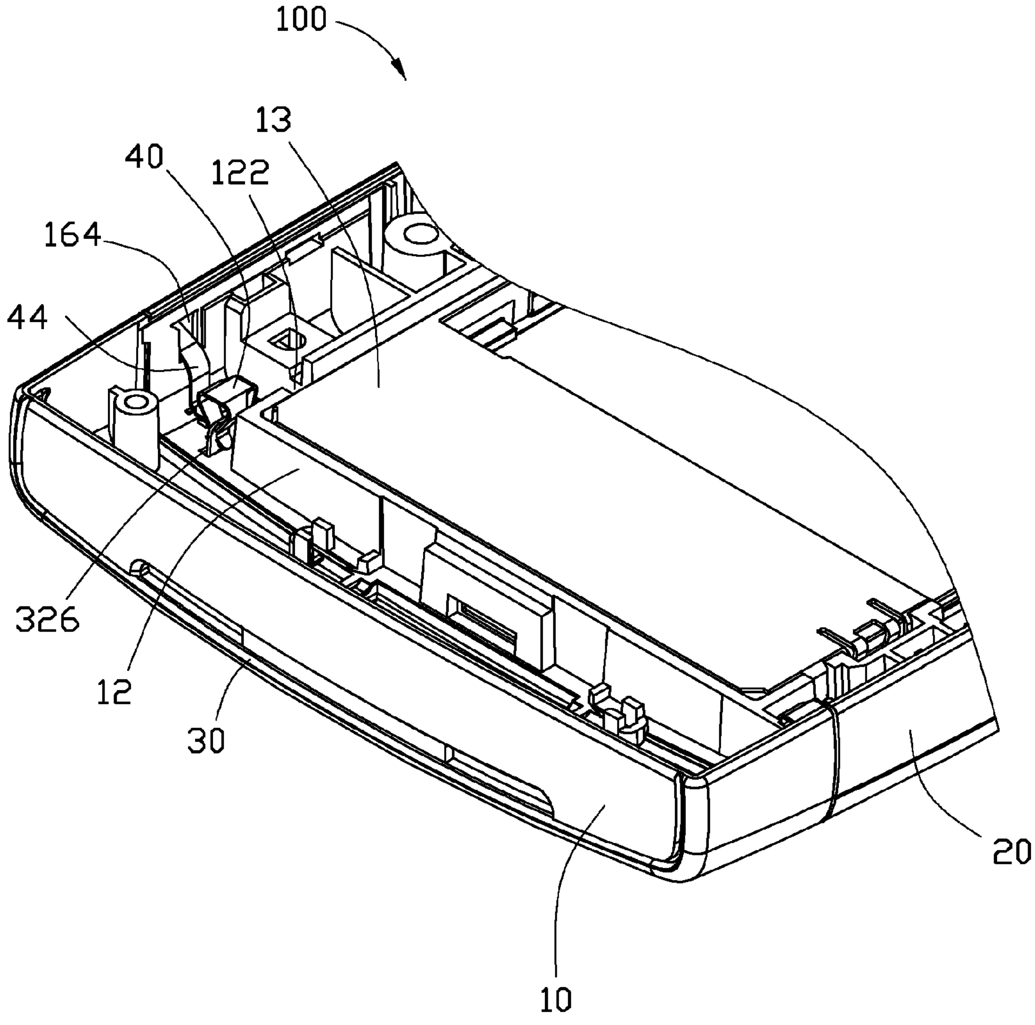
FIG. 3 is a view of part of the electronic device of FIG. 1 after the electronic device has been assembled.
Figure 4:
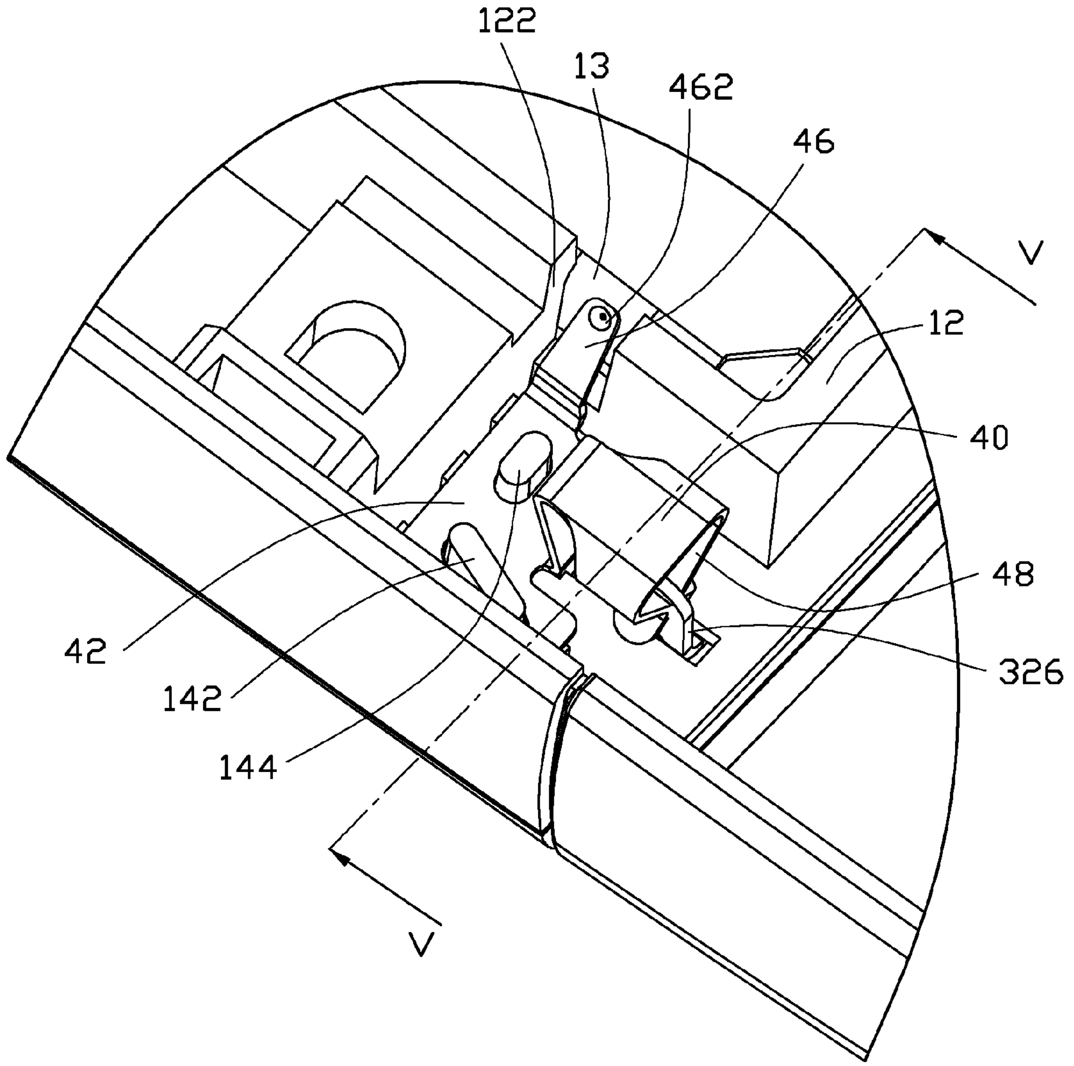
FIG. 4 is an enlarged, isometric view of part of FIG. 3, showing the elastic member attached to the electronic device.
Figure 5:
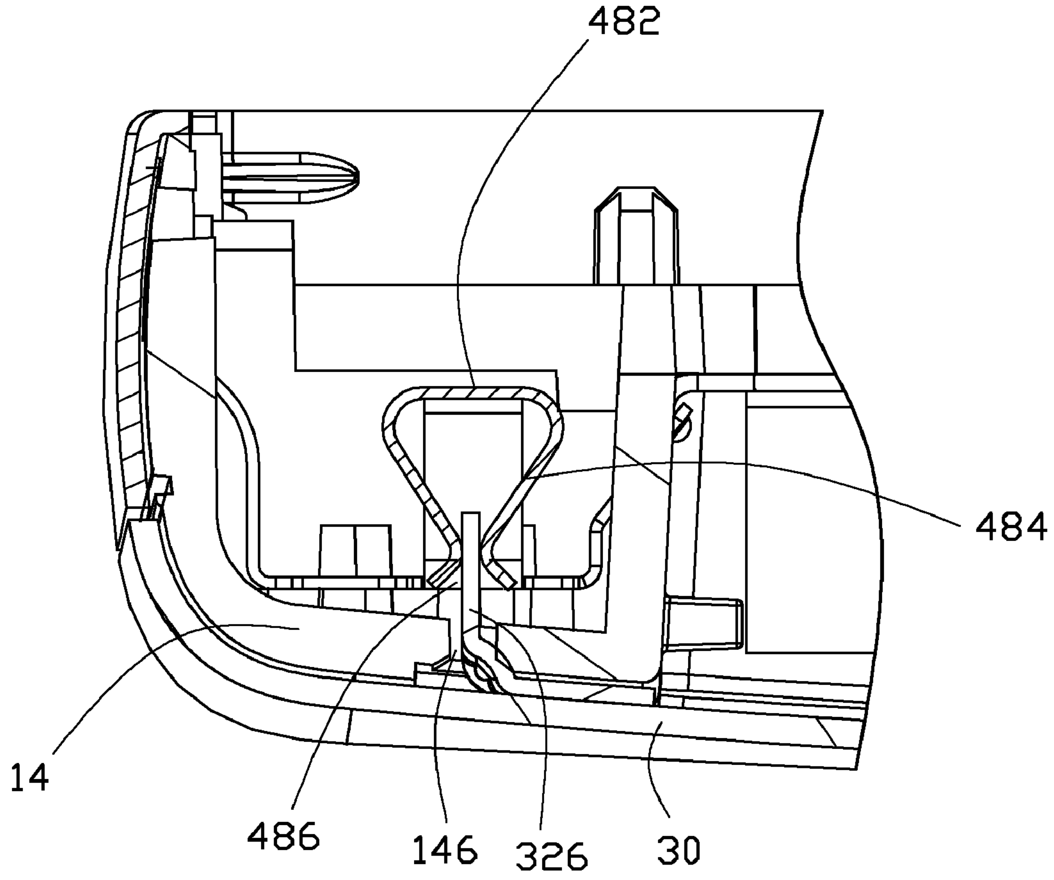
FIG. 5 is a cross-sectional view of FIG. 4 taken along line V-V thereof.

In assembly, referring also to FIGS. 3 to 5, the side plates 20 are fixed in the grooves 162 of the housing 10 by, e.g., adhesive or fusion. The battery cover 30 is attached to one side of the housing 10, and abuts against the base plate 14. The tabs 324 are inserted into the housing 10. The catches 326 extend through the notches 146 of the base wall 14. The first and second protrusions 142, 144 of one elastic member 40 are received in the first and second holes 422, 424, for fixing the elastic member 40 to the base wall 14. The arms 484 clamp a corresponding catch 326. The arcuate finger end 442 of the first bent portion 44 extends through the cutout 164 to abut against the side plate 20. The second bent portion 46 extends through the opening 122 to abut against the conductive member 13. Assembly of the other elastic member 40 is similar to that described above, and therefore is not detailed here. Thus, the battery cover 30 and the side plates 20 are electrically connected to a grounding pin of a main circuit board via the elastic members 40.

A significant advantage of the grounding mechanism is that the elastic members 40 are easily assembled to the housing 10. This simplifies assembly of the electronic device so that costs are reduced. In addition, the space occupied in the interior of the electronic device is minimized.

It is to be understood, however, that even though numerous characteristics and advantages of the present embodiments have been set forth in the foregoing description, together with details of assembly and function, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:

a housing including a base wall and a side wall, the base wall defining a notch, the sidewall defining a cutout, a frame formed on the base wall and spaced from the side wall, the frame defining an opening toward the sidewall;

a battery cover attached to the base wall, the battery cover including a catch extending through the notch;

at least one side plate attached to the side wall of the housing; and a grounding mechanism comprising:

a conductive member attached to the frame of the housing, and exposed from the opening; and an elastic member comprising:

a main portion attached to the base wall of the housing;

a first bent portion and a second bent portion respectively extending from two opposite ends of the main portion, the first bent portion extending through the cutout to abut against the side plate, the second bent portion extending through the opening to abut against the conductive member; and a clamping portion extending from one side of the main portion and clamping the catch to electronically connect the battery cover and the side plate with the conductive member.

2. The electronic device of claim 1, wherein the main portion defines a first hole and a second hole for fixing the elastic member to the base wall of the housing.

3. The electronic device of claim 1, wherein an arcuate finger end is formed on a distal end of the first bent portion, and a protrusion extends from a distal end of the second bent portion.

4. The electronic device of claim 1, wherein the clamping portion includes an angled section and a connecting section, the angled section is oriented at an approximately acute angle relative to the main portion, the connecting section is substantially perpendicular to the angled section, and is parallel to the main portion.

5. The electronic device of claim 4, wherein the clamping portion includes two arms extending from opposite sides of the connecting section, a first belled cavity, a second belled cavity are defined between the two arms, a clearance is defined at narrower ends of the first belled cavity and the second belled cavity and the catch of the battery cover is clamped in the clearance by the two arms.

* * * * *